United States Patent [19]

Silber et al.

[11] 4,208,669
[45] Jun. 17, 1980

[54] CONTROLLABLE SEMICONDUCTOR RECTIFIER WITH INTERFERENCE POTENTIAL COMPENSATION

[75] Inventors: Dieter Silber, Hausen; Marius Füllman, Neu-Isenberg; Karl-Julius Finck, Frankfurt; Wolfgang Winter, Eschborn, all of Fed. Rep. of Germany

[73] Assignee: Licentia Patent-Verwaltungs G.m.b.H., Fed. Rep. of Germany

[21] Appl. No.: 937,975

[22] Filed: Aug. 30, 1978

[30] Foreign Application Priority Data

Aug. 31, 1977 [DE] Fed. Rep. of Germany ....... 2739187

[51] Int. Cl.² .......................................... H01L 29/74
[52] U.S. Cl. ..................................... 357/38; 357/30; 357/55; 357/86
[58] Field of Search ..................... 357/30, 38, 55, 86

[56] References Cited

U.S. PATENT DOCUMENTS 4,122,480  10/1978  Silber et al. ........................... 357/38

Primary Examiner—Joseph E. Clawson, Jr.
Attorney, Agent, or Firm—McGlew and Tuttle

[57] ABSTRACT

A controllable semiconductor rectifier which is subject to an interference potential and controllable by a control power comprises a first emitter layer, a first main control electrode connected to the first emitter layer, a control base layer connected to the first emitter layer, a main base layer connected to the control base layer and a second emitter layer connected to the main base layer. A connection is established between a portion of the control base layer and the first emitter layer for applying a compensating potential to the first emitter layer for compensating the interference potential and a limiting non-linear component is connected between a portion of the control base layer and the first emitter layer for limiting the interference potential.

11 Claims, 13 Drawing Figures

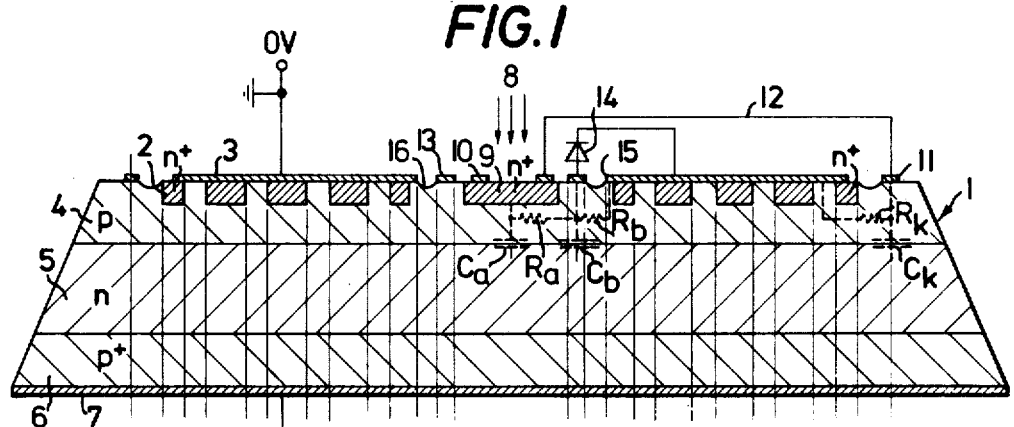
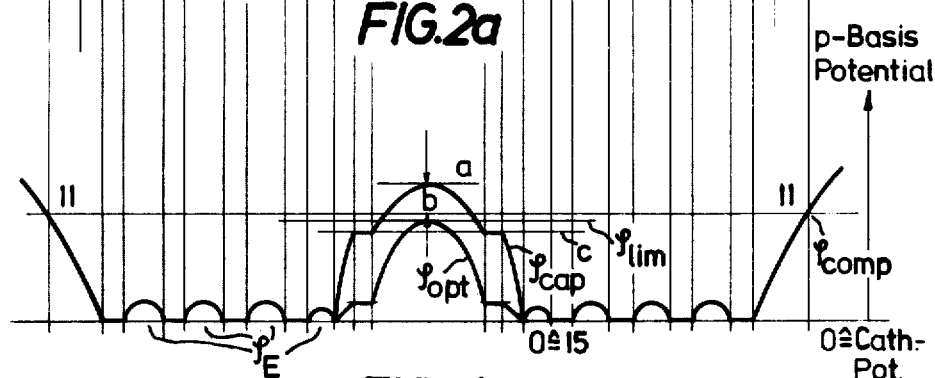
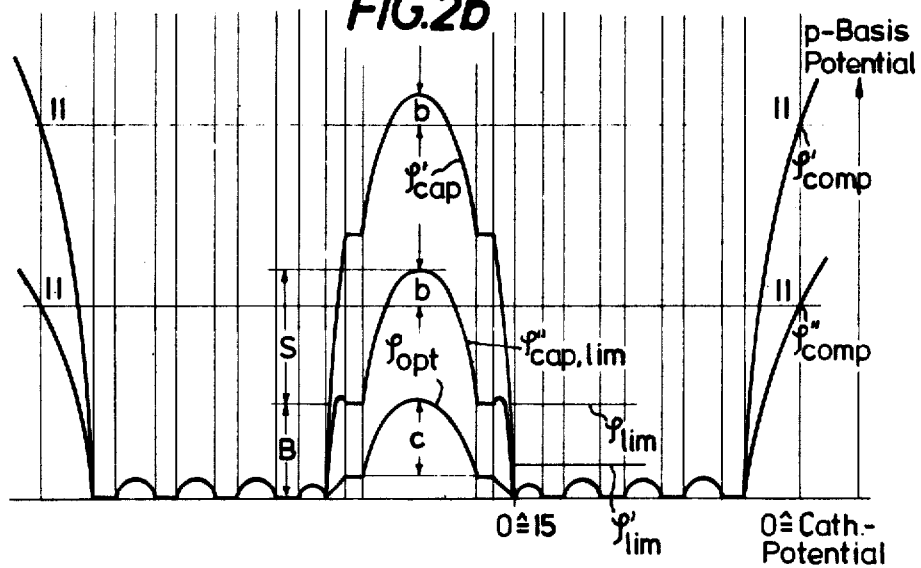

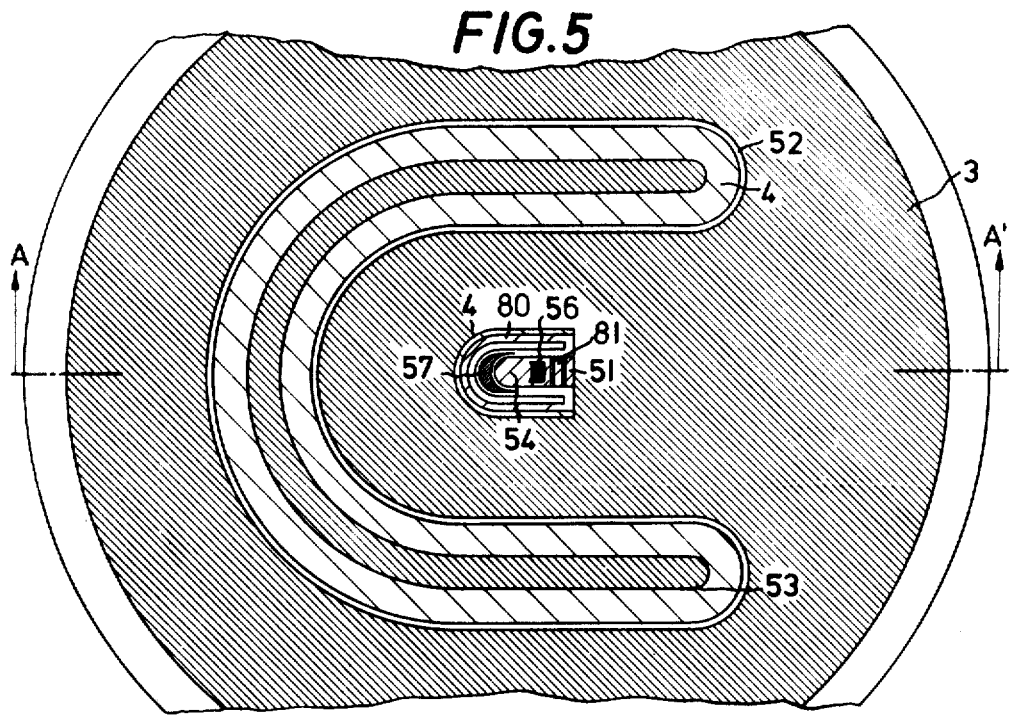
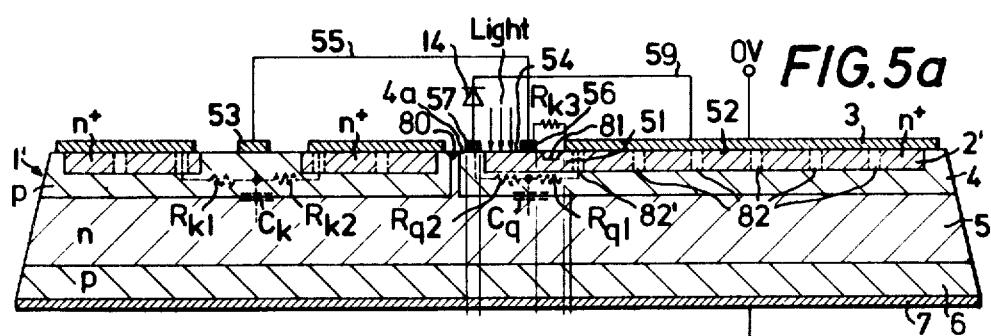
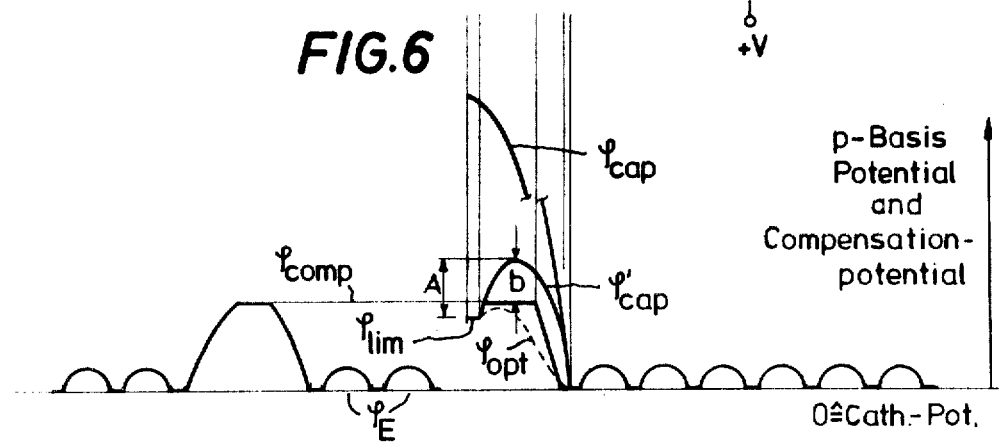

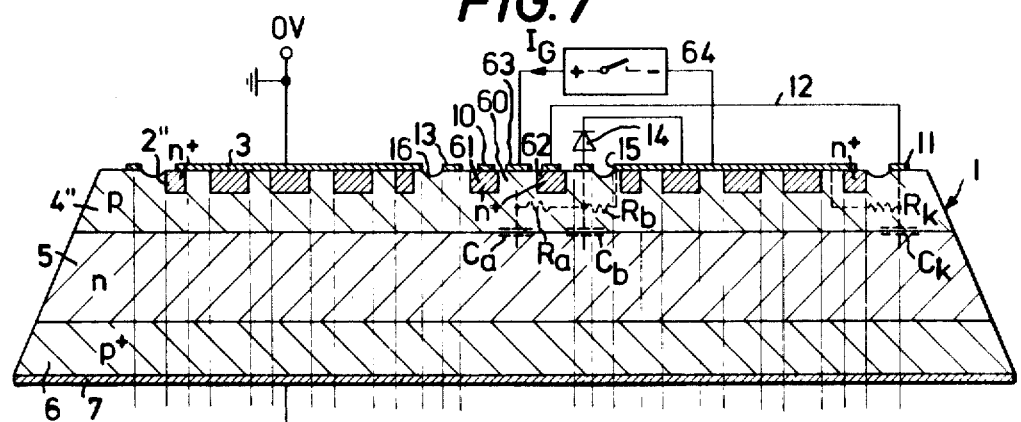
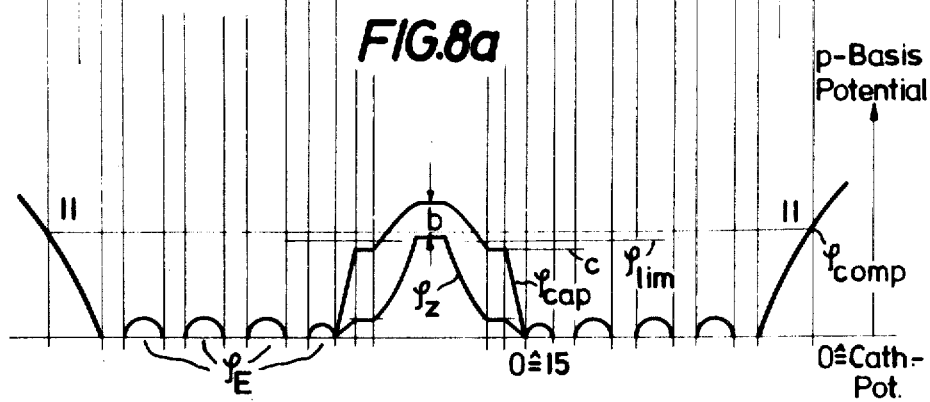
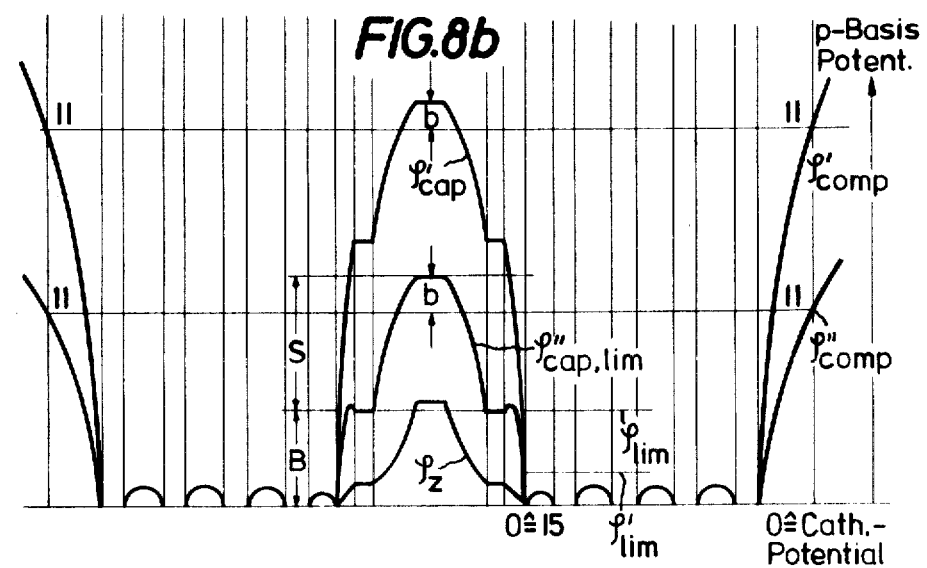

CONTROLLABLE SEMICONDUCTOR RECTIFIER WITH INTERFERENCE POTENTIAL COMPENSATION

FIELD AND BACKGROUND OF THE INVENTION

This invention relates in general to semiconductor devices and, in particular, to a new and useful controllable semiconductor rectifier in which the effect of interference potentials are reduced.

DESCRIPTION OF THE PRIOR ART

A light-controllable semiconductor rectifier having a plurality of layers with different conductivity is known. In this device, the area of the cathode-side n+ emitter layer which is ignitable or turned on by optical irradiation, receives a compensation potential which goes in the same direction as the interference potential of the adjacent intermediate layer for the purpose of avoiding ignition or turnon by interference currents. In this way, high ignition sensitivity is achieved and, du/dt interference ignitions and ignitions by high reverse currents are avoided. (See published German Application No. 25 49 563).

The light-controllable semiconductor rectifier consists of four layers, each of a type which has different conductivity. The cathode-side n+ emitter layer comprises, in addition to the radiation-sensitive area, further areas interconnected through a main electrode which also makes contact with the intermediate layer adjacent this n+ emitter layer, so that for a part of the N+ emitter layer emitter shorts are formed. In order to five the n+ emitter layer a potential corresponding to the interference potential of the adjacent intermediate layer when interference currents occur, the potential occurring at the edge of the adjacent intermediate layer is applied to the radiation-sensitive area by means of an ohmic connection. By this compensation process, the optical ignition sensitivity is separated from the interference ignition sensitivity since the potential occurring at the edge of the adjacent intermediate layer is not influenced by the irradiation of optical ignition energy, but is influenced by the interference currents, as has been explained above.

Due to the occurring interference currents, the interference potential of the adjacent intermediate layer may assume considerable values. The applied edge potential of the adjacent intermediate layer should correspond as precisely as possible to the maximally occurring potential of the intermediate layer within the radiation-sensitive area of the n+ emitter layer. This is because differences in these potentials have the effect of insufficient compensation and the semiconductor rectifier will then still be sensitive to interference ignition. In semiconductor rectifiers of the kind described, which are highly sensitive to light-ignition, there results a correspondingly very high interference potential in the adjacent intermediate layer, which can be compensated only by a correspondingly high potential influencing the radiation-sensitive area. Adjustment of the potential at the high potentials occurring, which compensates the interference potential presents difficulties, as will be explained in more detail hereinbelow.

In the power components of the above-stated kind, there occur, for example, du/dt requirements of over 1000 V/μs (at 125° C.), which bring about interference currents having a capacitive current density peak of some mA/mm$^2$. In components without compensation of the interference potential, the permissible potential increase of the adjacent intermediate layer, relative to the n+ emitter layer at 125° C. is less than 0.4 V.

On the other hand, for optical firing of the component at about 25° C., the optically generated control current must lead to a potential increase of about 0.7 V. Therefore, if an ignition-sensitive structure, (e.g., 0.5 mA/mm$^2$ control current density generated optically) is to withstand a du/dt interference of about 2000 V/μs, interference potentials on the order of 7 V must be compensated, and consequently, the compensation voltage must be greater than 6.6. V. Overcompensation, however, must be avoided, so that the element can still be fired or turned on into rising voltage flanks.

Because of the inevitable technological tolerances, the above stated values for the interference potential are often still higher in practice. It is not only difficult to "hit" the compensation potential, but engineering costs are expensive in order to generate this potential at the required magnitude (selective etching of an area of a defined surface resistance).

An optically ignitable semiconductor rectifier is also known having a four-layer structure and, wherein, the ohmic resistance is arranged between the cathode electrode and the control base electrode by which the optical ignition or turn-on sensitivity, as well as the interference ignition or turn-on sensitivity are adjustable. A relatively high resistance results in a correspondingly high ignition sensitivity, as even low control currents (optically generated as well as interference currents) generate a correspondingly high control base potential. Because of its susceptibility to interference ignation at the optical ignition sensitivities technically required, this semiconductor rectifier is used only in a small power range (SCR MANUAL, 1972, General Electric Co., pp 414 to 417).

Lastly, there are also known semiconductor rectifiers, ignitable by a control current which are equipped with an ignition electrode at which the ignition occurs by the control current ("Dynamic Problems of Thyristor Engineering"—in German-VDE-Verlag GmbH, Berlin 1971, pp. 128-138).

If such a semiconductor rectifier is designed for low control power, it will have a respective ignition sensitivity in the case of du/dt interference also.

SUMMARY OF THE INVENTION

It is the object of the present invention to achieve compensation of the interference potentials for controllable semiconductor rectifiers of high ignition sensitivity and of any structural design with high du/dt load and correspondingly high interference potentials in the control base layer. Another object is to simplify compensation in controllable semiconductor rectifiers already compensated.

A further object of the present invention is to provide a controllable semiconductor rectifier which is subject to an interference potential and controllable by a control power, comprising, a first emitter layer, a control base connected to said first emitter layer, a main base layer connected to said control base layer, a second emitter layer connected to said main base layer, a connection between a portion of said control base layer spaced from said first emitter layer and said emitter layer for applying a compensating potential to said emitter layer to compensate for the interference potential, and limiting means connected between said first emitter layer and a portion of said control base layer for limiting the interference potential.

The advantage of the invention consists in particular in that by providing the stated limitation in the intermediate layer interference potential, relatively low interference and compensation potentials are now achieved, so that the alignment sensitivity is greatly reduced. Another advantage is that the edge electrode of the adjacent intermediate layer can now be used to particular advantage as a control electrode, because of the low compensation potential to be supplied by it.

In the known interference-potential-compensated light-ignitable semiconductor rectifier, this is made difficult due to the high compensation potentials occurring at this electrode. These potentials require a relatively high resistance isolation in this electrode, so that firing across this electrode is not possible with relatively low voltages. Still another advantage is that the compensation potential need no longer be tapped from the edge zone of the semiconductor rectifier and thus there is great freedom of choice as to its structural form.

For an understanding of the principles of the invention, reference is made to the following description of typical embodiments thereof as illustrated in the accompanying drawings.

BRIEF DESCRIPTION OF THE DRAWINGS

In the Drawings:

FIG. 1 is a schematic sectional view of a light-controllable semiconductor rectifier according to the invention;

FIGS. 2a and 2b show two diagrams with interference and compensation potentials occurring when interference currents appear in the semi-conductor body, and their limitation;

FIG. 5 is a plan sectional view of another design of a light-controllable, interference potential compensated semiconductor rectifier, in accordance with the invention;

FIG. 5a is a view taken along the line A—A' of FIG. 5;

FIG. 6 is a potential diagram for a design according to FIG. 5;

FIG. 7 is a side sectional elevational view of a design of a current-ignitable, interference potential-compensated semiconductor rectifier in accordance with the invention;

FIGS. 8a and 8b are diagrams including the interference and compensation potentials occurring when interference currents appear at the semiconductor body according to FIG. 7, and their limitation.

DESCRIPTION OF THE PREFERRED EMBODIMENTS

Figure 3A:
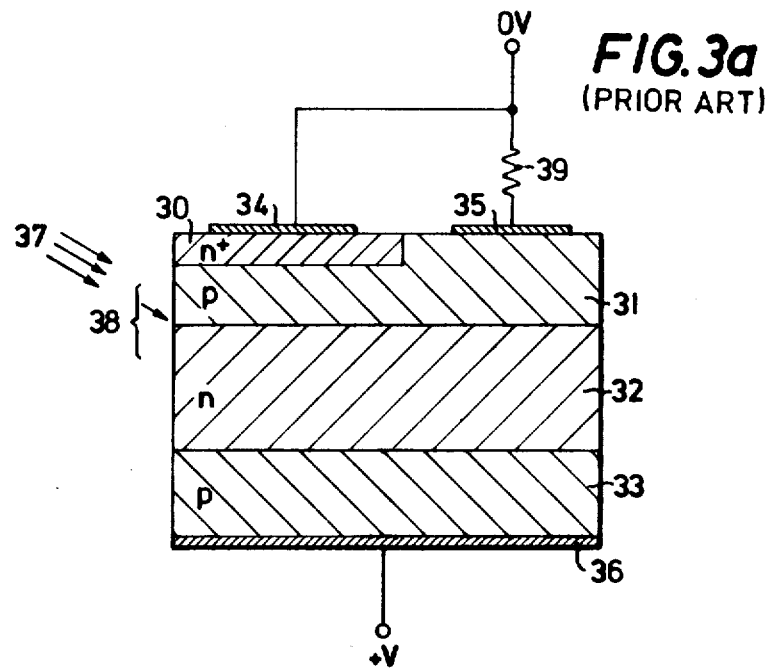
FIG. 3a is a schematic sectional view of a known design for a light-controllable semiconductor rectifier not compensated for interference potential.

Referring to the drawings in particular, the invention embodied therein in FIG. 1, includes a semiconductor rectifier, generally designated 1, comprising a first n+ emitter layer 2 with a first annular main electrode 3, which also makes ohmic contact with an adjacent p-control base layer 4, followed by an n-layer or main base layer 5, which is followed by a second p+ emitter layer 6 with a second main electrode 7. The n+ emitter layer 2 has an area 9 which can be exposed to light radiation 8, with a ring electrode 10 thereon. The rectifier is thus controllable by a control power, in this case light. At the edge of p-control base layer 4, a ring electrode 11 is arranged, which is connected via a line 12 with the electrode 10 of area 9 of the n+ emitter layer 2.

Upon occurrence of du/dt interference currents or forward-blocking currents, in the central portion of the p-control base layer 4, an interference potential $phi_{cap}$ results, which brings about an interference ignition. In order to avoid this, a compensation potential $phi_{comp}$ approximately corresponding to the interference potential $phi_{cap}$ is imparted to the ignition area 9 of the n+ emitter layer 2. This potential occurs at the edge electrode 11 and is applied to area 9 of the n+ emitter layer 2 via line 12 and electrode 10.

The design of the semiconductor rectifier and its operation in this embodiment until now are known. According to the invention, the interference potential $phi_{cap}$ of the p-control base layer 4 is limited by limiting means connected between the first emitter layer and the control base layer. This can be done in various ways. In the semiconductor rectifier according to FIG. 1, the p-control base layer 4 is provided with a ring electrode 13 connected with the main electrode 3 of the n+ emitter layer 2 via component 14 of non-linear characteristic in the vicinity of the radiation sensitive area 9 of the n+ emitter layer 2. The non-linear current voltage characteristic of the component is selected so that a high differential equivalent resistance exists below a given voltage and a small one exists above the given voltage. Components 14 may, for example, comprise a silicon pn-diode.

The operation of the semiconductor rectifier 1 will be explained in greater detail with reference to the diagrams of FIGS. 2a and 2b. To facilitate comprehension in FIG. 1, the surface resistances $R_a$, $R_b$ are indicated as lying between the area 9 of electrode 13, with the associated mean equivalent capacitances $C_a$, $C_b$ of the corresponding areas of the pn-junction (between 4 and 5). A surface resistance $R_k$ is indicated between the edge electrode 11 and the main electrode 3, with capacitance $C_k$.

In FIGS. 2a and 2b, where the abscissa of the graphs correspond with the width of the rectifier, the ignition potential $phi_{opt}$ causing a desired ignition or turn-on is shown and the interference potential $phi_{cap}$ causing an undesired ignition is also shown. The compensation potential $phi_{comp}$ associated with the interference potential, and the limitation $phi_{lim}$ of the interference potential in relation to the semiconductor body are also indicated.

In FIG. 2a, an interference potential $phi_{cap}$ has been assumed to be of a magnitude such that although a compensation potential $phi_{comp}$ is connected in opposition to it, it need not yet be limited.

Interference potentials occurring between the emitter shorts, which have no influuence are indicated at $phi_E$. The optical ignition potential $phi_{opt}$ has its zero point at the inner edge 15 (FIG. 1) of the main electrode 3 at zero potential. The initial curve of the optical ignition potential phi$_{opt}$ is adjusted by an etched depression 16 in p-control layer 4 which does not vary over the electrode 13. The curve then rises relatively steeply and reaches its maximum, i.e., the ignition limit of about 0.7 V, in the center of the semiconductor body.

The optical ignition potential phi$_{opt}$, therefore, rises at first relatively gradually and then much more steeply. The reason for this progression will be explained in greater detail in connection with the diagram of FIG. 2b.

The interference potential phi$_{cap}$ also has its zero point at the inner edge 15 of the main electrode 3, rises relatively steeply up to electrode 13, remains at the same level over it, and then rises again to a maximum a. The interference potential phi$_{cap}$ at an interference here assumed, is greater than the optical ignition potential phi$_{opt}$ and, therefore, would lead to an undesired firing or turn-on of the device. This is prevented by the compensation potential phi$_{comp}$ which is tapped from electrode 11, which emphasizes the area 9 of the n+ emitter layer 2 in the vicinity of the interference potential phi$_{cap}$, so that there now exists between this area 9 and the adjacent portion of the p-control base layer 4 only a potential difference b which is smaller than the required ignition potential, so that the semiconductor rectifier does not fire despite the existence of an inteference potential phi$_{cap}$ which is greater than the optical ignition potential phi$_{opt}$ required for the desired ignition or turn-on.

The current through diode 14 assumes values which attain the order of magnitude of the reactive currents in the p-base layer 4 at a potential phi$_{lim}$, and exceed it. Depending on the type of diode used, the current varies in a potential range of ±0.1 V by factors between 50 and 2500 (at 300° K.), so that this approximation of a reference potential is justified. In the case assumed in FIG. 2a, however, the interference potential phi$_{cap}$ assumes at the limitation point a value c below phi$_{lim}$, so that the effect of diode 14 remains negligibly small. Therefore, a limitation of the interference potential phi$_{cap}$ does not occur.

In FIG. 2b, it is assumed that in the central portion of the p-control base layer 4, an interference potential phi'$_{cap}$ occurs which is several times greater than that according to FIG. 2a. A compensation potential phi'$_{comp}$ is connected in opposition to the interference potential phi'$_{cap}$ so that, between area 9 of the n+ emitter layer 2 and the central portion of the p-control base layer 4, a potential difference b again results which does not lead to firing.

According to the invention, the interference potential is limited. As can be seen from FIG. 2b, this interference potential phi'$_{cap}$ is of such magnitude that at the ring electrode 13, there appears a potential phi'$_{cap}$ > phi$_{lim}$ such that diode 14 becomes conducting and thereby, the high interference potential phi'$_{cap}$ is limited to the low interference potential phi''$_{cap,lim}$. Therefore, the compensation potential phi'$_{comp}$ needs to assume only the magnitude phi''$_{comp}$. Again, between the central portion of the p-control base layer 4 and area 9 of the n+ emitter layer 2 there acts only the potential difference b of interference potential phi''$_{cap,lim}$ and compensation potential phi''$_{comp}$, which cannot lead to firing.

The curve form of the interference potential phi''$_{cap,lim}$ is determined by the surface resistance R$_a$, R$_b$ with associated equivalent capacitances C$_a$, C$_b$ and the diode 14 (FIG. 1). The capacitances C$_a$ and C$_b$ result from the areas of the central pn junction and, in case of interference, they furnish the interference current I$_{Ca}$, I$_{Cb}$. The equivalent capacitances C$_a$, C$_b$ are in a ratio of about 1:10. The interference current I$_{Ca}$ flows across the surface resistance R$_a$ whose voltage share I$_{Ca}$×R$_a$ is not limited by the diode 14, so that the portion S (FIG. 2b) of the interference potential phi''$_{cap,lim}$ will, depending on the magnitude of the interference, also be different in magnitude. Since diode 14 lies parallel to the surface resistance R$_b$ (electrode 10, 3), as the potential phi$_{lim}$ inherent in diode 14 is being reached or exceeded at electrode 10, diode 14 becomes conducting and, hence, limits the voltage component B of the interference potential phi''$_{cap,lim}$ resulting from (I$_{Ca}$+I$_{Cb}$)×R$_b$ (FIG. 2.).

By a certain layout of the geometry of area 9 and of the central portion of the adjacent p-control base layer 4 associated with that area (etching zone 16, arrangement of electrode 13) it results that the limitation phi$_{lim}$ of the interference potential phi''$_{cap,lim}$ also does not act on the optical potential phi$_{opt}$. As can be seen from FIG. 2b, the curve forms of the optical potential curve phi$_{opt}$ and of the interference potential curve phi''$_{cap,lim}$ are clearly different. The mean width of the optical ignition potential curve phi$_{opt}$ is smaller than the mean width of the interference potential curve phi''$_{cap,lim}$. The limitation potential phi$_{lim}$ can thus be reduced, for example, to about the point phi'$_{lim'}$, without thereby causing a limitation also of the optical ignition potential phi$_{opt}$ to occur. This makes it possible in particular to go slightly beyond the ignition limit with the optical ignition potential phi$_{opt}$ in order to thus achieve a rapid switching-on of the semiconductor rectifier. As the limitation of the interference potential phi''$_{cap,lim}$ is placed solely in the lower rise thereof and portion S is left uninfluenced, the optical ignition potential phi$_{opt}$ is not adversely affected by the limitation even if it becomes greater than the potential phi$_{lim}$.

The interference potential, therefore, is definitely reduced without effect on the optical ignition potential.

Due to the possibility of selecting the limitation potential phi'$_{lim}$, metal semiconductor diodes, as for instance Schottky diodes, also can be used as limitation means, without reduction of the optical ignition sensitivity.

A known optical ignitable semiconductor rectifier, according to FIG. 3a, has a four-layer structure with an n+ emitter layer 30, a p-control base layer 31, an n-main base layer 32, and a p-emitter layer 33. The n+ emitter layer 30 is provided with a cathode electrode 34, the p-control base layer 31 with a control base electrode 35, and the p-emitter layer 33 with an anode electrode 36. The light irradiation 37 occurs laterally in area 38 of the layers 31, 32. The n+ emitter layer 30 constitutes the ignitable area of the component.

The cathode electrode 34 has zero potential and the anode electrode 36 positive potential. Between the cathode electrode 34 and the control base electrode 35, a resistance 39 (e.g. about 50 Ohms) is arranged, by which the optical ignition sensitivity and also the interference ignition sensitivity are adjustable. As has been previously mentioned, this semiconductor rectifier is relatively prone to interference ignition.

In accordance with the invention, a relatively high resistance 39 can be selected in such a semiconductor rectifier, so that high optical ignition sensitivity at simultaneously high du/dt interference safety is achieved by the limitation of the interference potential and the compensation of the residual interference potential.

Figure 3B:
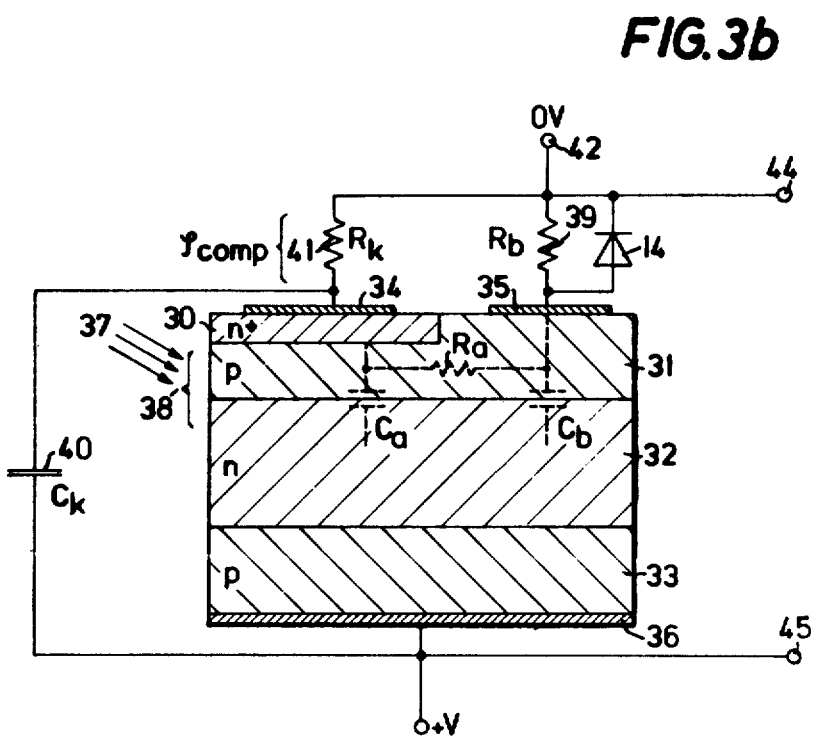
FIG. 3b is a view similar to FIG. 3a of a semiconductor rectifier according to FIG. 3a with inteference potential compensation.

According to FIG. 3b, there is provided for the purpose of compensation of the interference potential of the p-control base layer 31, an RC-circuit consisting of a capacitor 40 and a resistor 41, capacitor 40 being connected to the anode electrode 36 and cathode electrode 34, and resistor 41 to the cathode electrode 34 and to the zero potential terminals 42. The RC-circuit is adapted to the internal capacitances and shunt resistances of the component. The limitation of the interference potential of the control base layer 31 is effected by means of a diode 14 which is connected in parallel with the resistor 39 applied to the control base electrode 35 and terminal 42.

In the case of du/dt interference, an external capacitive current is generated by the RC-circuit 40, 41 and hence a compensation potential $phi_{comp}$ which corresponds to the interference potential of the p-control base layer 31 and extends in the same direction. This compensation potential $phi_{comp}$ occurring at the resistor 41 acts at the electrode 34 of the n+ emitter layer 30, so that a potential is applied to this layer which corresponds to the interference potential of the control base layer as to direction and thus firing is prevented. Since capacitor 40 has a fixed capacitance, while the pn-junction capacitance of the layers 31, 32 is voltage-dependent, a suitable mean value is selected for the capacitance of capacitor 40.

Figure 4:
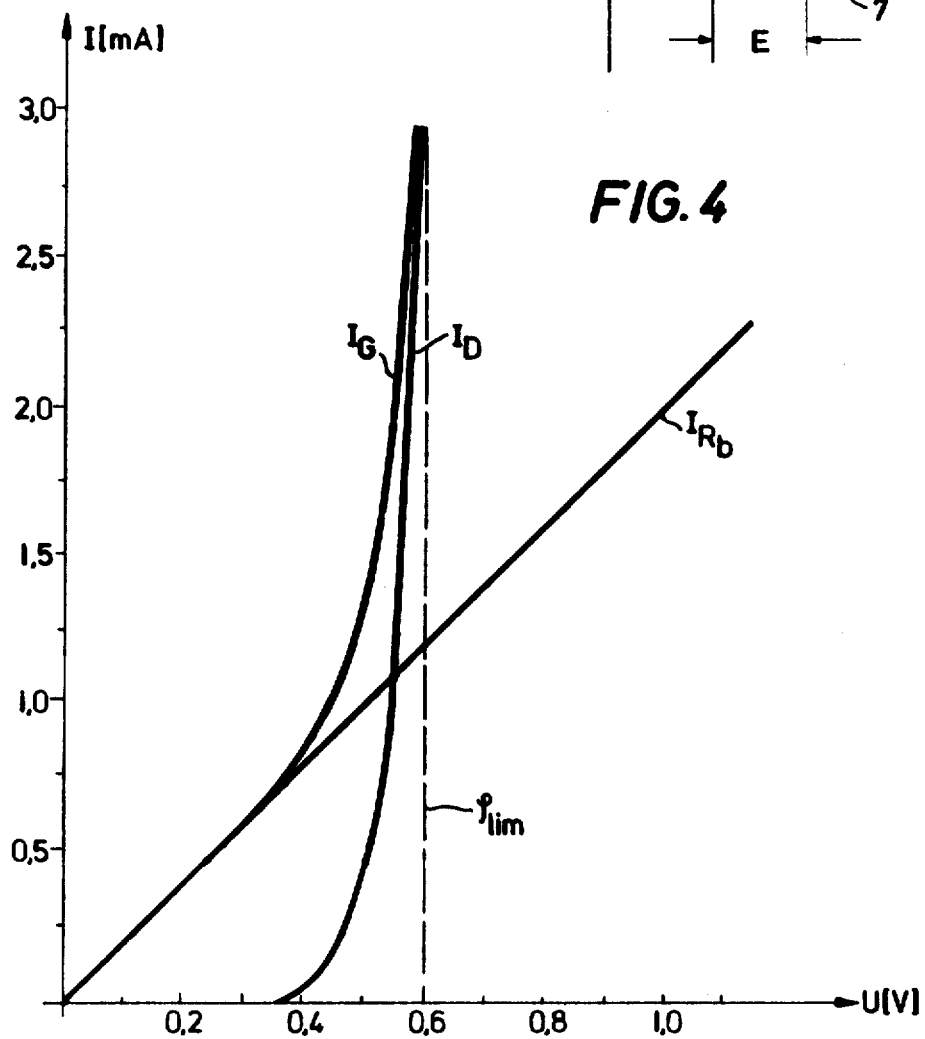
FIG. 4 is a siagram illustrating the operation of a semiconductor rectifier according to FIG. 3b.

The potential compensation is improved by the potential limitation diode 14, as the du/dt interference potential of layer 31 to be compensated, is greatly reduced. By using the potential-limiting diode 14, therefore, the capacitor 40 and the resistor 41 present in the load circuit can be made much smaller. The effectiveness of the limitation will be explained in greater detail with reference to FIG. 4.

The ignition current is plotted on the ordinate and the voltage occurring between terminal 42 and electrode 35 is plotted on the abscissa. The current characteristic $I_R$ of resistor 39 is shown with the current characterstic $I_D$ of diode 14, and the current characterstic $I_G$ of the combination of resistor 39 and diode 14.

As can be seen from the diagram, to about 0.5 V, there is as yet no effect of the diode (about 0.5 mA) or, respectively, of the combination of diode and resistor (about 1.5 mA). When a potential of 0.6 V is reached, which corresponds to the selected limitation potential $phi_{lim}$, diode 14 becomes fully conducting, and a current greater than 3.0 mA flows.

Therefore, if about 0.5 V appears at the control base electrode 35, and if it is assumed that an additional potential of about 0.2V occurs at the equivalent resistance $R_a$, the semiconductor rectifier is indeed fired (about 0.7 V), but due to the diode 14, no appreciable impairment of the optical ignition sensitivity occurs because the combination of diode 14 and resistor 39 carries at 0.5 V a current $I_G$ of about 14 mA, which is insignificantly greater than the current $I_R$ (about 1.0 mA) flowing through resistor 39 only. The effect of the combination diode 14, resistor 39 will occur at 0.6 V at the control base electrode 35 and the interference potential is limited to this value.

The compensation potential resulting at resistor 41 in the case of du/dt interference thus needs to compensate essentially only the interference potential occuring additionally at the equivalent resistance $R_a$. This obviates restrictions in the rating of resistor 39, so that the latter can be taken relatively high, and a high optical ignition sensitivity is thereby obtained.

A controllable power semiconductor rectifier may be connected to terminals 44, 45 in a known manner, for which the optically ignitable thyristor according to the invention constitutes an external "gate amplifier", that is, a primary-fired pilot thyristor.

The light-ignitable semiconductor 1', according to FIGS. 5 and 5a, differs from that of FIG. 1 in that the compensation potential $phi_{comp}$ is tapped, not at the edge of the semiconductor body, but at a point where there results a potential which is in itself much too small for compensating the occurring high interference potential $phi_{cap}$, but which is perfectly sufficient in its magnitude because of the applied limitation of the interference potential.

It thus becomes possible by the limitation of the interference potential to select, for the compensation thereof, practically any points of the control base layer 4, resulting in only relatively low compensation potentials, the potential of which is applied to the area of the n+ emitter layer 2' exposed to the incidence of light.

The semiconductor rectifier 1' differs from that according to FIG. 1 further by including a continuous (cohering) n+ emitter layer 2' with the cohering areas 51, 52, with the irradiation area 51 no longer being separated from the total area 52, so that the ignition propagation can proceed also by carrier diffusion from area 51 to area 52 and can thus diffuse out when the terminal voltages at the rectifier are small.

Although only relatively low compensation potentials occur in such a semiconductor rectifier and, thus, only actually a relatively low light sensitivity would be attainable because the interference potentials must be kept low, a high light sensitivity is now obtainable because high interference potentials now no longer occur because of the limitation, as they are brought to the magnitude of the available compensation potentials.

The value of the compensation potential at electrode 53 is given by the equivalent resistances $R_{k1}$ and $R_{k2}$, which are in parallel with another equivalent resistance $R_{K3}$ which is formed by the cohering areas 51, 52 of the n+ emitter layer and cannot be made large.

For the compensation potential at electrode 53, therefore, an RC combination is at hand which consists of the equivalent capacitance $C_k$ and the equivalent resistances $R_{k1,2,3}$ connected in parallel.

Electrode 53 is U-shaped and serves at the same time as a sequential gate having the following mode of operation:

The ignition area of the optically fired portion of the semiconductor is shown at 54. When under high operating voltage, this area 54 has switched through, there immediately occurs a correspondingly high current, and the ignition area 54 receives a large part of this current from electrode 53 via a connection 55 and an electrode 56 located on the irradiation area 54. This current acting as a control current for the remaining semiconductor rectifier, firing it in the entire edge around electrode 53, so that the ignition in this large outer edge causes the semiconductor rectifier to absorb the load current with a very short time delay ($<1\mu s$) and thus to relieve the optical area 54.

Near area 54, on a portion 4a of the control base layer 4, which is drawn to the surface, an electrode 57 which partially embraces the optical area 54 is arranged, to which a diode 14 is connected limiting the interference potential of the control base layer 2 and connected with the cathode electrode 3 via a line 59. Accordingly, an embracing potential limitation of area 54 occurs.

A portion of n-main base layer 5 is also drawn to the surface in a very narrow area 80, whereby, the optical currents generated in layer 4, below area 54, can drain only in the direction of the emitter short 82', while draining in other directions is prevented.

The mode of operation of the semiconductor rectifier will be explained in greater detail below with reference to the diagram of FIG. 6.

As can be seen, in the case of interference without limitation, a relatively high capacitive interference potential $phi_{cap}$ with approximately parabolic rise (semi-parabola) occurs, while the compensation potential $phi_{comp}$ is relatively low. The optical potential $phi_{opt}$, like the interference potential $phi_{cap}$, has an approximately semi-parabolic shape.

The interference potential $phi'_{cap}$ at electrode 57 is fixed to the limitation potential $phi_{lim}$ by the potential limitation $phi_{lim}$ of diode 14 which, when using, for example, a Si-pn diode, is about 0.5 to 0.6 V. It has been assumed in the example that the optical potential $phi_{opt}$ is somewhat higher than the limitation potential $phi_{lim}$, so that the optical potential $phi_{opt}$ is slightly limited, but not in the maximum.

When the diode 14 is present, a capacitive current $I_q$ drains to electrode 3 via the series connection of equivalent resistance $R_{q2}$ and diode 14 as well as via equivalent resistance $R_{q1}$. Without diode 14, the current $I_q$ would drain via the equivalent resistance $R_{q1}$ only, so that a greater interference potential $phi_{cap}$ would result. The portion A of the interference potential $phi'_{cap}$ to be essentially compensated is therefore considerably smaller than the nonlimited interference potential $phi_{cap}$.

The transverse conductivity of the n+ emitter layer 2 gives the equivalent resistance $R_{k3}$ which is in parallel with the equivalent resistance $R_{k1,2}$. Thereby, a current is transmitted from electrode 53 via line 55 to electrode 56 which drains through the n+ emitter areas 51, 52 to the cathode electrode 3. This results within the area 51 between the electrodes 56 and 3 in a location-dependent compensation potential $phi_{comp}$ which has its zero point at the point of area 51 covered by the cathode electrode 3 and which up to electrode 56 rises over an area 81 reduced in its layer thickness by etching, and then remains constant.

The zero points of the potential of the control base layer 4 in the emitter shorts 82 and, in particular, the zero point of the interference potentials $phi_{cap}$, $phi'_{cap}$ and of the optical potential $phi_{opt}$, are not necessarily located at the same point as the zero point of the compensation potential $phi_{comp}$.

The semiconductor rectifier which is ignitable or turned-on by control current, according to FIG. 7, is identical with the design according to FIG. 1, except for the central portion 60 of the n+ emitter layer 2 and p-control base layer 4.

In the semiconductor rectifier, according to FIG. 7, in the ignitable area between the innermost annular n+ area 61 of the n+ emitter layer 2", a portion 60 of the p-control base layer 4" extends upwardly and this portion 60 is provided with an ignition electrode 63 at which the firing occurs by a control current $I_g$. This positive current $I_g$ which is fed, for example, from an electronic switch 64, flows into the p-control base layer 4 in area 60.

No potential difference prevails in part 60. Accordingly, an ignition potential $phi_z$, flattened in the peak results, as can be seen from the diagram S of FIGS. 8a and 8b.

In the diagrams, the same interference potentials $phi_{cap}$, $phi'_{cap}$, $phi''_{cap,lim}$, compensation potentials $phi_{comp}$, $phi'_{comp}$, $phi''_{comp}$ and limitation potentials $phi_{lim}$, $phi'_{lim}$ are assumed as in the diagrams of FIGS. 2a and 2b, and accordingly, with respect to the compensation of the interference voltage potentials and the limitation thereof, the same effect occurs as in the optically ignitable semiconductor rectifier according to FIG. 1.

In FIG. 8a, it is again assumed that the interference potential $phi_{cap}$ at the ring electrode 13 does not reach the limitation potential $phi_{lim}$ inherent in the diode 14 and that, therefore, a limitation of the interference potential $phi_{cap}$ does not occur.

In FIG. 8b, the interference potential $phi'_{cap}$ has a magnitude such that limitation thereof is meaningful and occurs through diode 14. As can be seen from the diagrams, the ignition potential $phi_z$ is not affected by the limitation and the ignition sensitivity is thus not impaired.

In the case of du/dt, it may happen that due to the wiring of the controllable semiconductor rectifier, a capacitive interference current is additionally coupled in through the ignition electrode 63, whereby, the interference potential is further increased. This added interference can be made ineffective by a slight overcompensation.

A semiconductor diode may be used as an element with a non-linear characteristic, whose forward recorvery time must be short enough that dynamic elevation of the limitation potential $phi_{lim}$ does not occur. The diode may constitute a hyrbrid or an integrated component. If a hybrid component is used, a thermic coupling is desirable with the semiconductor rectifier as, in that case, the limitation potential $phi_{lim}$ and the minimum ignition potential of the control base of the semiconductor rectifier will vary with the temperature in the same sense.

A metal semiconductor diode is available, as an integrated component for the diode 14, which may be formed from the metal electrodes 13, 35, 37 (FIGS. 1, 3 and 5), and the semiconductor material lying therebelow. Because of the p-diffusion by which the control base layer 4 is generally produced, it may be necessary additionally to thin (etch) the layer in the electrode area in order to obtain a suitable characteristic.

Figure 9:
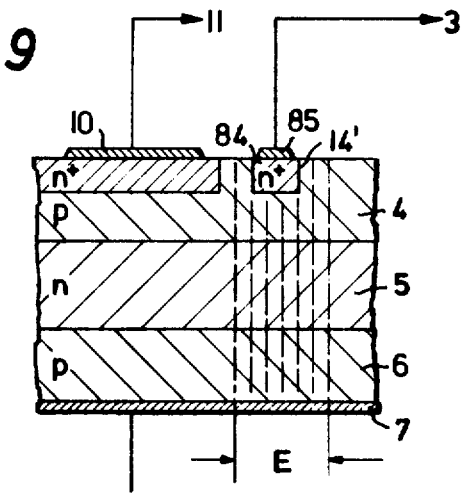
FIG. 9 is a side sectional view of another design for an integrated semiconductor diode used in the semiconductor rectifiers.

The semiconductor diode may also be formed by a diffused-in layer, as is schematically indicated in FIG. 9, in which, as an example, a part of the semiconductor body, according to FIG. 1, is illustrated. Diode 14' is formed by an annularly diffused n+ layer 84, which is provided with an electrode 85. The interference currents to be removed must be prevented from leading to an interference ignition due to electron injection from layer 84, however. This can be prevented by doping the p-control base layer 4 especially highly in the area below layer 84, as the electron transport factor is thereby greatly reduced.

The interference ignition can also be prevented by introducing a high density of recombination centers into the semiconductor body in the area E of layer 84, and this can be done, for example, by local radiation with high-energy electrons (energy > 1 MeV).

While specific embodiments of the invention have been shown and described in detail to illustrate the application of the principles of the invention, it will be understood that the invention may be embodied otherwise without departing from such principles.

What is claimed is:

1. In a controllable semiconductor rectifier controllable by a control power and exposed to an interference potential, having a plurality of layers of different conductivity types, two outer layers thereof being provided with main electrodes and one of the outer layers adapted to be an electron or hole emitter having an area which is ignitable by the control power to be supplied and which upon occurrence of the interference potential receives a compensation potential which goes in the same direction as the interference potential of the adjacent intermediate layer in the area fired primarily by the control power, the improvement comprising means connected between said one outer layer adapted to be an electron or hole emitter and the adjacent intermediate layer for limiting the interference potential of this layer.

2. A semiconductor rectifier according to claim 1, in which an ignition potential characteristic curve of the semiconductor rectifier has a main width which is narrower than the main width of a limited interference potential characteristic curve of a limited interference potential and said limiting means applying said limitation in the area of rise of the interference potential characteristic curve.

3. A semiconductor rectifier according to claim 1, wherein said limiting means comprises a non-linear element disposed in the area of occurrence of the interference potential of the adjacent intermediate layer which is connected with one of said main electrodes, said one of said main electrodes comprising a cathode-side connecting contact.

4. A semiconductor rectifier according to claim 3, wherein said non-linear elements comprises a semiconductor diode with a short forward recovery time.

5. A controllable semiconductor rectifier which is subject to an interference potential and controllable by a control power comprising, a first emitter layer, a control base layer connected to said first emitter layer, a main base layer connected to said control base layer, a second emitter layer connected to said main base layer, a connection between a portion of said control base layer spaced from said first emitter layer and said first emitter layer for applying a compensating potential to said first emitter layer to compensate for the interference potential and limiting means connected between said first emitter layer and a portion of said control base layer for limiting the interference potential.

6. A controllable semiconductor rectifier according to claim 5, wherein the control power comprises light and said limiting means comprises a semiconductor diode.

7. A controllable semiconductor rectifier according to claim 6 further including a first main electrode connected to a portion of said first emitter layer, a second main electrode connected to said second emitter layer, a portion of said first emitter layer disposed centrally in the control of the rectifier not connected to said first main electrode, said connection for the compensating potential connected between a portion of said control base layer adjacent an edge spaced from the center of the rectifier and said central portion of said first emitter layer, said diode connected between a portion of said control base layer adjacent said central portion of said first emitter layer and said first main electrode.

8. A controllable semiconductor rectifier according to claim 6 further including a first main electrode connected to said first emitter layer covering a major portion of said first emitter layer and leaving a central portion of said first emitter layer uncovered for exposure to light, a portion of said control base layer extending around said uncovered portion of said first emitter layer, said connection for the compensating potential connected between an electrode on said exposed portion of said first emitter layer and a substantially U-shaped electrode on exposed portion of said control base layer, said semiconductor diode connected between an electrode on said portion of said control base layer disposed around said exposed portion of said first emitter layer and said first main electrode.

9. A controllable semiconductor rectifier according to claim 5, wherein the control power comprises light, a first main electrode connected to said first emitter layer, a control base electrode connected to a portion of said control base layer spaced from said first emitter layer, a second main electrode connected to said second emitter layer, a capacitor connected between said first and second main electrodes, said first main electrode and said control base electrode connected to a zero potential terminal, a resistor connected between said zero potential terminal and each of said first main electrode and said control base electrode, and a diode connected between said control base electrode and said zero potential terminal.

10. A controllable semiconductor rectifier according to claim 7, wherein said diode is formed by doping in the vicinity of said first emitter layer.

11. A controllable semiconductor rectifier according to claim 5 further including means for providing a control current comprising the control power for controlling the controllable semiconductor rectifier.

* * * * *